United States Patent
Cho et al.

(10) Patent No.: US 8,259,514 B2
(45) Date of Patent: Sep. 4, 2012

(54) SENSE AMPLIFIER AND METHOD OF SENSING DATA USING THE SAME

(75) Inventors: Caleb Yu-Sheng Cho, Zhubei (TW); Chia-Fu Lee, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/364,000

(22) Filed: Feb. 1, 2012

(65) Prior Publication Data

US 2012/0127815 A1    May 24, 2012

Related U.S. Application Data

(63) Continuation of application No. 12/712,607, filed on Feb. 25, 2010, now Pat. No. 8,130,566.

(51) Int. Cl.
  *G11C 7/00* (2006.01)
(52) U.S. Cl. .............. 365/189.11; 189/203; 189/205; 189/195.25
(58) Field of Classification Search ............ 365/189.11, 365/189.07, 203, 205, 185.25
See application file for complete search history.

(56) References Cited

U.S. PATENT DOCUMENTS

| | | | |
|---|---|---|---|
| 6,104,655 A * | 8/2000 | Tanoi et al. ............ 365/205 |
| 6,424,585 B1 * | 7/2002 | Ooishi ................ 365/226 |
| 6,462,584 B1 * | 10/2002 | Proebsting ............ 327/52 |
| 7,057,957 B2 | 6/2006 | Wang |
| 7,313,042 B2 | 12/2007 | Hidaka |
| 7,826,246 B2 * | 11/2010 | Albasini et al. ........ 365/145 |
| 2001/0028590 A1 | 10/2001 | Ishikawa et al. |
| 2005/0162953 A1 | 7/2005 | Morikawa |
| 2006/0083091 A1 | 4/2006 | Edahiro |
| 2007/0206432 A1 | 9/2007 | Ishikawa et al. |
| 2009/0040806 A1 * | 2/2009 | Albasini et al. ........ 365/145 |

\* cited by examiner

*Primary Examiner* — Tuan T. Nguyen
(74) *Attorney, Agent, or Firm* — Lowe Hauptman Ham & Berner, LLP

(57) ABSTRACT

Some embodiments regard a circuit comprising a pre-charge circuit and a latch circuit. The pre-charge circuit charges a voltage node to a pre-determined voltage level based on which the latch circuit generates a feedback signal to stop the pre-charge circuit from charging.

20 Claims, 6 Drawing Sheets

SENSE AMPLIFIER AND METHOD OF SENSING DATA USING THE SAME

CROSS REFERENCE TO RELATED APPLICATIONS

The present application is a continuation application of Ser. No. 12/712,607, filed Feb. 25, 2010, which is incorporated herein by reference in its entirety.

FIELD

The present disclosure is generally related to integrated circuits, and, in various embodiments, to a sense amplifier.

BACKGROUND

Sense amplifiers usually use a pre-charge circuit, which, in many situations, are not process tracking and thus cause slower access in some operation corners. An operation corner refers to a device/transistor having a dopant type (e.g., N, P implants) biased by a process (e.g., fast N, slow P; fast P, slow N, etc) and operating at a particular temperature and/or voltage level (e.g., normal, low, or high Vdd, etc.). Further, the pre-charge voltage of the amplifier is generally fixed by the process, and is therefore not adjustable.

In an approach, to increase the access time, the pre-charge bias (e.g., pre-charge voltage) is raised to the operation voltage (e.g., Vdd) minus the threshold voltage of the transistors used in the circuit (e.g., Vt). This voltage Vdd–Vt, however, can be a limitation under some circumstances. Further, at different process corners, the pre-charge circuit comprising two serial N transistors does not track the sensing inverter comprising a P transistor in series with an N transistor. As a result, the sense amplifier behaves differently for different speeds of the different dopant types because the voltage level that changes the output logic of the inverter (e.g., the trip point) varies depending on the different process corners.

In another approach that uses a p-type Field Effect Transistor (pFET) in the pre-charge circuit, the pre-charge bias depends on the loading of a bit line (e.g., the BL loading). Inaccurate BL loading estimation, however, can affect the read access. For example, an over-charged bias because of an inaccurate BL loading estimation can cause a slower reading of the data with the current flowing when the memory is accessed, while an under-estimated BL loading can cause a slower reading of the data with small or no current flowing.

BRIEF DESCRIPTION OF THE DRAWINGS

The details of one or more embodiments are set forth in the accompanying drawings and the description below. Other features and advantages of the embodiments will be apparent from the description, drawings, and claims.

Like reference symbols in the various drawings indicate like elements.

DETAILED DESCRIPTION

Figure 1:
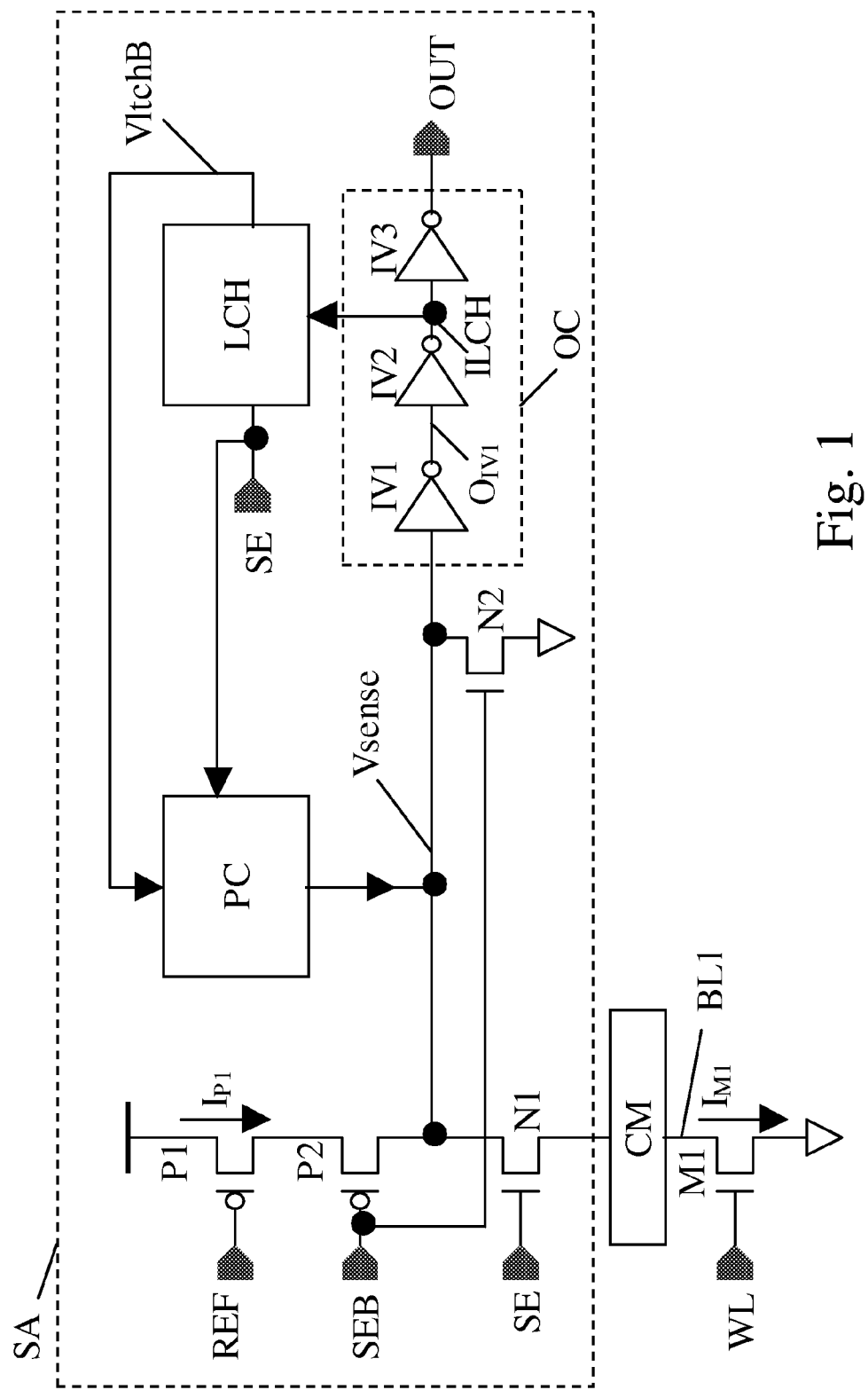
FIG. 1 is a schematic diagram of a sense amplifier circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of principles disclosed in this document are contemplated as would normally occur to one of ordinary skill in the pertinent art. Reference numbers may be repeated throughout the embodiments, but do not necessarily require that feature(s) of one embodiment apply to another embodiment, even if they share the same reference number.

Exemplary Circuit

FIG. 1 is a diagram of an exemplary sense amplifier circuit 100, in accordance with some embodiments. In this illustration, sense amplifier SA is used to sense/read the data stored in memory cell M1 via output OUT. Further, reading memory cell M1 comprises two stages, e.g., a pre-charging stage and a sensing stage.

Transistor N1 serves a switch (e.g., a gating transistor) between column multiplexer (e.g., column mux) CM and sense amplifier SA via node Vsense (e.g., the drain of transistor N1). If transistor N1 turns on, node Vsense, via transistor N1, is coupled to column mux CM and thus memory cell M1. But if transistor N1 turns off, node Vsense is electrically disconnected from column mux CM and memory cell M1. In some embodiments, a transistor N1 corresponds to a plurality of bit lines coupled to column mux CM.

Column mux CM couples to a plurality of bit lines, e.g., 32, 64, 128 bit lines, etc., depending on configuration of a particular memory design. For illustration, only one bit line BL1 is shown in FIG. 1. Generally, a bit line corresponds to a memory cell. In FIG. 1, bit line BL1 corresponds to memory cell M1. Column mux CM selects a particular bit line (e.g., bit line BL1) when appropriate (e.g., when reading from/writing to the memory cell) such that the selected bit line BL1 and its corresponding memory cell M1 is electrically coupled to transistor N1 and therefore node Vsense of sense amplifier SA.

Transistor M1 serves as a memory cell storing data at the drain of transistor M1. In some embodiments, if the data is "0" (e.g., low, low logic level), memory cell M1 is in the program state, and draws no current, i.e., current $I_{M1}$ is 0. But if the data is "1" (e.g., high, high logic level, etc.), memory cell M1 is in the erase state, and current $I_{M1}$ flows. When memory cell M1 is selected for reading, the bit line BL1 or the drain of transistor (e.g., memory cell) M1 is selected and biased by column mux CM. At the same time, signal (e.g., word line) WL at the gate of transistor M1 is selected and biased by a word line decoder (not shown). If memory cell M1 stores high data, biasing the gate (e.g., activating word line WL) and the drain (e.g., selecting the bit line) of transistor M1 causes current $I_{M1}$ to flow. But if memory cell M1 stores low data, current $I_{M1}$ does not flow.

Signal WL is a word line signal from a memory array commonly known in the art, and controls transistor M1. When signal WL is activated (e.g., driven high), transistor M1 turns on, and data stored in transistor M1 is accessed for reading, but when signal WL is de-activated (e.g., driven low), transistor M1 turns off preventing data access from transistor M1.

Transistor P2 serves as a gating transistor (e.g., a switch) for reference current $I_{P1}$ provided by transistor P1 to flow through node Vsense as appropriate. When signal SEB is activated (e.g., driven low), transistor P2 turns on and allows current $I_{P1}$ to flow through node Vsense, but when signal SEB is deactivated (e.g., driven high), transistor P2 turns off preventing current $I_{P1}$ from flowing through node Vsense.

In some embodiments, current $I_{P1}$ (e.g., a reference current) is mirrored from another current source (not shown). Signal REF controls the magnitude of the mirrored current $I_{P1}$ through transistor P1. When memory cell M1 stores high data, some embodiments use the ratio $I_{P1}/I_{M1}$ to determine whether memory cell M1 is considered to have current $I_{M1}$ flow or not. For example, if the ratio $I_{P1}/I_{M1}$ is greater than a predetermined ratio, cell M1 is considered to have current $I_{M1}$ flow. But if the ratio $I_{P1}/I_{M1}$ is less than the predetermined ratio, cell M1 is considered to have no current $I_{M1}$ flow. In some embodiments, the predetermined ratio $I_{P1}/I_{M1}$ is less than 1, for example, ⅓. When the high data stored in memory cell M1 is read, if the current ratio $I_{P1}/I_{M1}$ is greater than the predetermined ratio (e.g., greater than ⅓), the large current $I_{M1}$ with respect to current $I_{P1}$ enables voltage Vsense to be pulled from a high (e.g., less than or equal to trip point trip_iv5, below) to a low.

Node Vsense is configured to transfer the data stored in a memory cell (e.g., memory cell M1) via output circuit OC comprising inverters IV1, IV2, and IV3 to output OUT for reading. Node Vsense is also the input of inverter IV1 having a trip point trip_iv1. When the voltage at node Vsense is less than the trip point trip_iv1, inverter IV1 considers node Vsense as a low logic, and converts this low logic to a high logic at the output of inverter IV1, e.g., output $O_{IV1}$. As a result, node ILCH, through inverter IV2, is at a low logic and output OUT, through inverter IV3, is at a high logic. On the other hand, when the voltage at node Vsense is greater than trip point trip_iv1, inverter IV1 considers voltage Vsense as having a high logic, and inverter IV1 inverts this high logic to a low logic. As a result, node ILCH, the input of latch LCH, through inverter IV2, is high, and output OUT, through inverter IV3, is low.

In some embodiments, at the beginning of a read cycle, signal SE is driven low, causing node Vsense to be at a low logic level. Node ILCH, resulting from voltage Vsense passing through two inverters IV1 and IV2 in series, is also at a low logic level, which enables latch circuit LCH to provide the signal VltchB (e.g., low) to reset pre-charge circuit PC. Signal SE is then driven high, allowing pre-charge circuit PC to charge node Vsense to a high logic level. Inverters IV1 and IV2 pass the signal (e.g., voltage level) at node Vsense to node ILCH to control latch LCH. When node Vsense is sufficiently charged to a high, node ILCH is also high, which enables latch LCH to provide the charge-disable signal VltchB (e.g., a low logic) to disable pre-charge circuit PC to stop charging node Vsense. Inverter IV3 inverts the data at node ILCH, which is at the same logic level as node Vsense, to form an output read data at output OUT.

In some embodiments, reading data at node Vsense and thus output OUT occurs after node Vsense is charged to trip point trip_iv1, which refers to the voltage level at which the output of inverter IV1 changes the logic state. Before the pre-charged circuit PC is turned off by the low logic level of signal VtlchB, the voltage at node Vsense is still charged towards the trip point of inverter IV5 (e.g., trip_iv5) in circuit 200 or voltage Vdd in circuit 400 during the signal transition from ILCH to PchgB and Pchg in circuit 200 or PchgB in circuit 400. After signal VtlchB falls to a low logic level (e.g., Vss), pre-charge circuit PC is turned off. At that point, the voltage at node Vsense is determined by the competing currents $I_{P1}$ and $I_{M1}$. If $I_{P1}>I_{M1}$, node Vsense is charged towards Vdd, resulting in a low (e.g., Vss) at node OUT, reflecting the low data stored in memory cell M1. But if $I_{M1}>I_{P1}$, node Vsense is pulled towards Vss, resulting in a high (e.g., Vdd) at node OUT, reflecting the high data stored in memory cell M1.

Pre-charge circuit PC charges node Vsense when appropriate (e.g., during a pre-charge cycle, before reading). Signal VltchB turns on/off pre-charge circuit PC. During pre-charging, signal VltchB enables pre-charge circuit to charge node Vsense. During sensing/reading, signal VltchB disables pre-charge circuit PC for sense amplifier SA to sense the data at node Vsense.

Latch circuit LCH controls (e.g., enables/disables) pre-charge circuit PC. Latch circuit LCH detects the pre-charge condition and provides the feedback signal VltchB to pre-charge circuit PC for it to charge or stop charging node Vsense. Because latch circuit LCH includes a feedback signal VltchB, latch circuit LCH can be called a feedback circuit.

Transistor N2 provides a current path to pull node Vsense to a low (e.g., ground or Vss) when appropriate. For example, at the beginning of a read cycle, node Vsense is disconnected from both transistor P1 and memory cell M1, but is connected to the then turned-on transistor N2, which pulls its drain (e.g., node Vsense) to its source (e.g., ground).

The Pre-Charge Circuit

Figure 2:
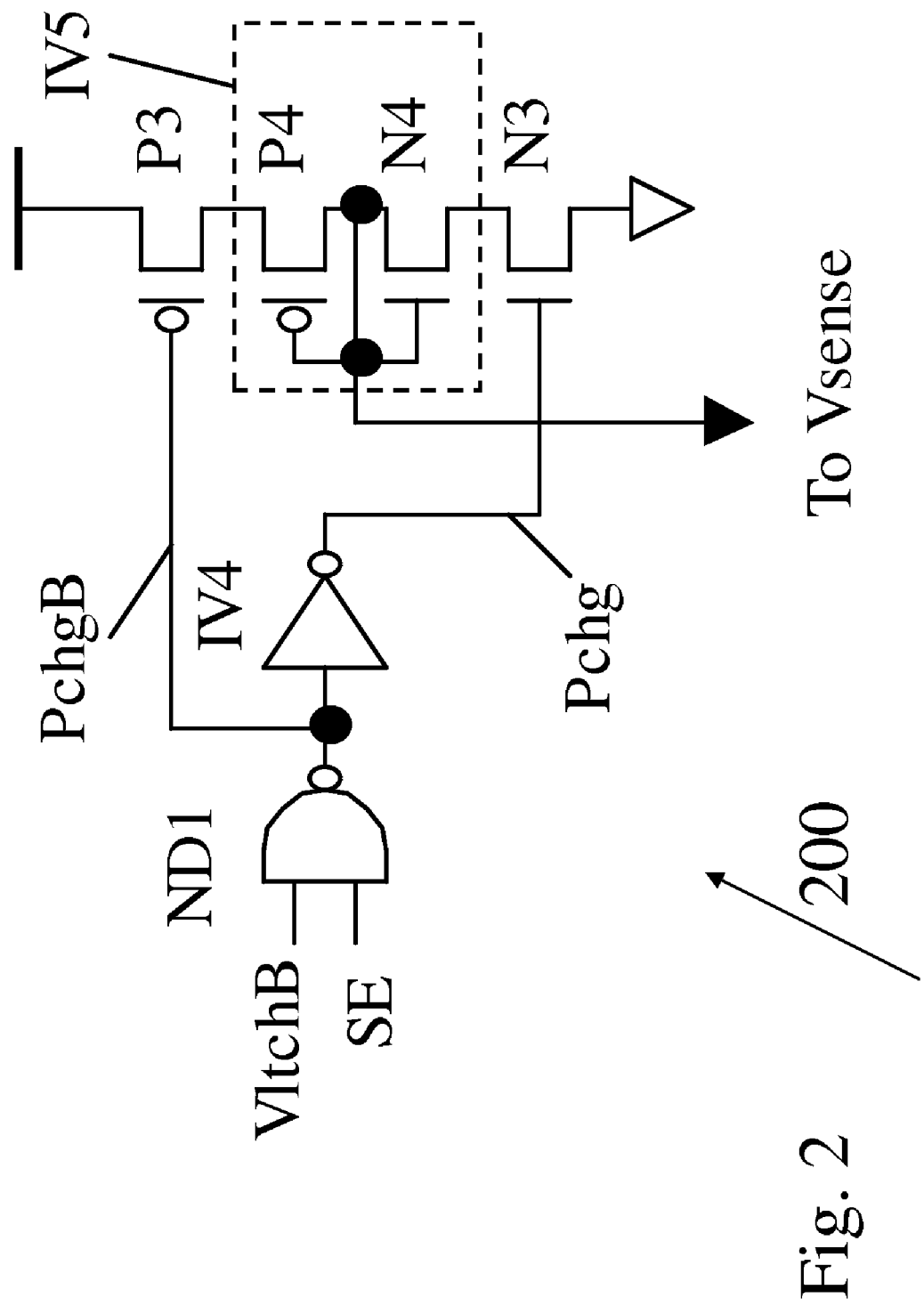
FIG. 2 is a detailed schematic diagram of the pre-charge circuit in FIG. 1, in accordance with some embodiments.

FIG. 2 is a diagram 200 showing in detail the pre-charge circuit PC (e.g., circuit 200) in accordance with some embodiments.

NAND gate ND1 generates signal PchB from signals VltchB and SE to control transistor P3. Inverter IV4 inverts signal PchgB to generate signal Pchg to control transistor N3. Both transistors P3 and N3 are configured to turn on/off at the same time. For example, when signal PchgB is low, transistor P3 turns on. At the same time, signal Pchg, the inverse logic of signal PchgB, being high also turns on transistor N3. In contrast, when signal PchgB is high, transistor P3 is off while signal Pchg being low turns off transistor N3.

Transistors P3 and N3 serve as a switch to control pre-charge circuit 200. When transistors P3 and N3 are off, there is no current path for transistors P3, P4, N4, and N3. Pre-charge circuit 200 is therefore off. When transistors P3 and N3 turn on, a current path is created from voltage Vdd through transistors P3, P4, N4, and N3 through ground, pre-charge circuit 200 is on to pre-charge node Vsense. At that time, transistors P4 and N4 acting as an inverter (e.g., inverter IV5) having its input comprising the gates of transistors P4 and N4 and its output comprising the drains of transistors P4 and N4 coupled together.

For a further example, when signal SE is low, signal SE overrides signal VltchB at NAND gate ND1, results in signal PchgB being high, and turns off transistors P3 and N3 (i.e., turn off pre-charge circuit PC). At the same time, node Vsense is at a low logic level, causing latch circuit LCH to generate a high signal VltchB. Signal SE is then activated (e.g., high) for reading, which together with the then high signal VltchB causes a low at signal PchgB, which turns on transistor P3 and N3 or pre-charge circuit 200. Pre-charge circuit 200 then charges node Vsense towards the trip point of inverter IV5 (e.g., trip_iv5), which, in some embodiments, is the maximum voltage that node Vsense can reach from pre-charge circuit 200. In some embodiments, trip point trip_iv5 is designed to be higher than trip point trip_iv1 with a predetermined and acceptable difference to adapt to variations of process, operation voltage, and temperature (PVT). This is done by appropriately selecting the size of transistor IV5 and/or IV1. When the voltage at node Vsense is charged just over trip point trip_iv1, pre-charge circuit PC is configured to turn off. As a result, pre-charging the voltage at node Vsense stops after several gate delays from the time signal ILCH rises to a high and propagates through latch circuit LCH and pre-charge circuit PC. During this shut-off transition, node Vsense is still charging towards trip point trip_iv5. Consequently, at the sensing stage (e.g., as soon as pre-charge circuit PC turns off), the logic level at node Vsense is determined by the competing currents $I_{P1}$ and $I_{M1}$, trip_iv1, and trip_iv5.

When the voltage at node Vsense is charged to or a little over trip point trip_iv1, the voltage at node Vsense causes latch circuit LCH to generate a low signal at VltchB fed back to NAND gate ND1, which overrides signal SE and causes a high signal at PchgB to turn off transistors P3 and N3, and thus stops pre-charge circuit 200 from charging node Vsense. In some embodiments, trip point trip_iv5 is the maximum pre-charge voltage that Vsense can reach due to the short circuits between the input and output of inverter IV5. The voltage at node Vsense, in some embodiments, is charged towards trip point trip_iv5 and stops increasing between trip_iv1 and trip_iv5.

Inverters IV5 and IV1

Figure 3:
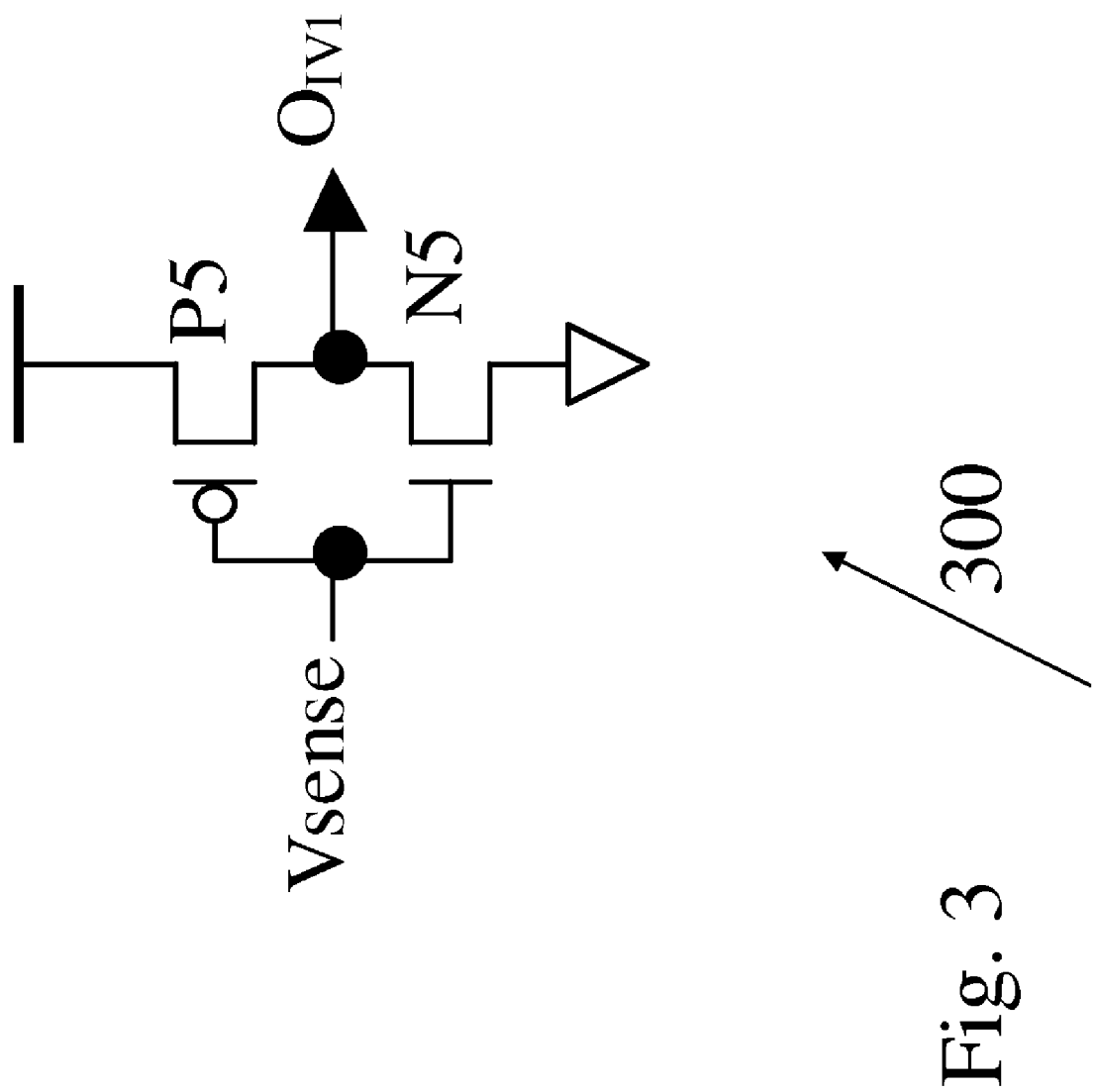
FIG. 3 is a detailed schematic diagram of an inverter in FIG. 1, in accordance with some embodiments.

FIG. 3 is a diagram showing in detail inverter IV1 (e.g., inverter 300), in accordance with some embodiments. Inverter 300 comprises PMOS transistor P5 coupled in series with NMOS transistor N5, both of which are configured similar to PMOS transistor P4 and NMOS transistor N4 of inverter IV5. Because each inverter IV1 and IV5 includes a PMOS and an NMOS transistor, they track each other, i.e., one compensates for the effect of the other one. The PMOS transistors P4 and P5 track one another while the NMOS transistors N4 and N5 track one another. For example, if PMOS transistor P4 in inverter IV5 is a fast transistor compared to a normal transistor due to a biased manufacturing process, then PMOS transistor P5 in inverter IV1 is also a fast transistor because of the same manufacturing process. For another example, if PMOS transistor P4 being fast causes trip point trip_iv5 to be higher than that of a normal transistor, the PMOS transistor P5, also being fast also causes trip point trip_iv1 to be higher. Similarly, if PMOS transistor P4 in inverter IV5 is a slow transistor compared to a normal transistor due to a biased manufacturing process, then PMOS transistor P5 in inverter IV1 is also a slow transistor because of the same manufacturing process. For another example, if PMOS transistor P4 being slow causes trip point trip_iv5 to be lower than that of a normal transistor, the PMOS transistor P5, also being slow also causes trip point trip_iv1 to be lower. The tracking effect of NMOS transistors is similar to that of PMOS transistors. Further, the tracking for both PMOS and NMOS transistors occurs at different processes, voltages, and temperatures.

Some embodiments configure trip point trip_iv5 to be higher than, but substantially closer to, trip point trip_iv1. In such embodiments, when the voltage at node Vsense is charged towards trip point trip_iv5, which is higher than trip point trip_iv1, when the voltage at node Vsense is between trip_iv1 and trip_iv5, charging stops to prevent the voltage at node Vsense from further increasing/charging. Otherwise, the voltage at node Vsense rises to a higher voltage level, and takes a longer time to be pulled down to a low logic level when desired.

In some embodiments, the trip point of an inverter (e.g., trip_iv1 for inverter IV1 and trip_iv5 for inverter IV5) is adjusted by adjusting the size of one or a combination of the corresponding PMOS transistor and NMOS transistor (e.g., P5 and/or N5 for inverter IV1, and P4 and/or N4 for inverter IV5). Further, trip point trip_iv1 and trip_iv5 are selected such that trip_iv5 is greater than trip_iv1 for various variations of process (P), operation voltage (V), and temperature (T). Because of the same composition of a P transistor (e.g., P5 for inverter IV1 and P4 for inverter IV5) in series with an N transistor (N5 for inverter IV5 and N4 for inverter IV5), trip points trip_iv1 and trip_iv5 track one another. That is, both trip points trip_iv1 and trip_iv5 increase or decrease together. Because of the smaller the difference between trip_iv1 and trip_iv5, the faster the access time circuit 100 has, in some embodiments, trip_iv5 and trip_iv1 are configured to be as close as possible.

The Pre-Charge Circuit

Some Further Embodiments

Figure 4:
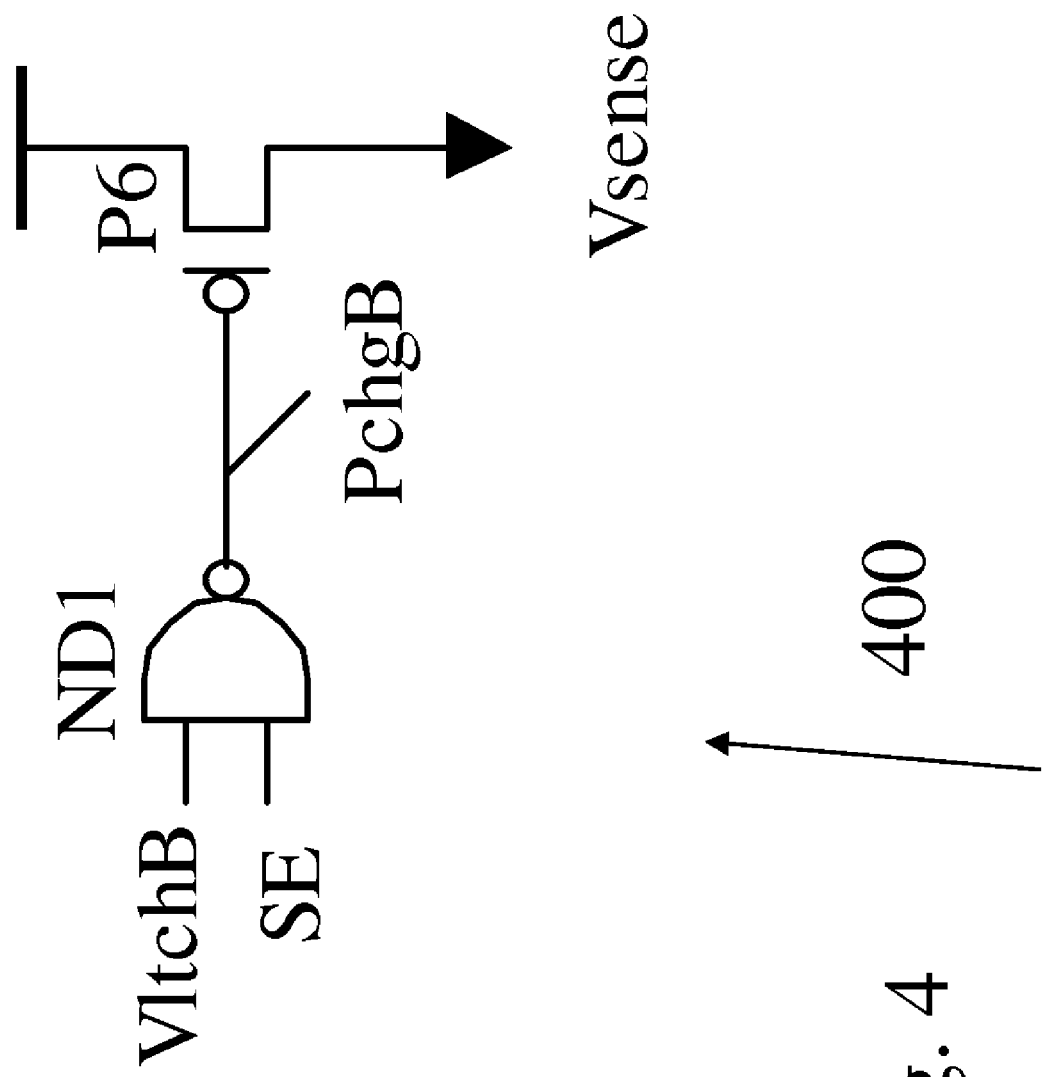
FIG. 4 is a detailed schematic diagram of the pre-charge circuit in FIG. 1, in accordance with some further embodiments.

FIG. 4 is a diagram showing details of the pre-charge circuit PC (e.g., circuit 400), in accordance with some further embodiments. The sequence of charging and stop charging of pre-charge circuit 400 is similar to that of pre-charge circuit 200. NAND gate ND1 and its inputs VltchB and SE and output PchgB are the same as in pre-charge circuit 200. For example, when NAND gate ND1 generates a low signal PchgB, signal PchgB turns on transistor P6 and charges node Vsense to Vdd of transistor P6. When NAND gate ND1, on the other hand, generates a high signal PchgB, signal PchgB turns off transistor P6 and stops charging node Vsense. Generating signal PchgB is illustrated in FIG. 2.

The Latch Circuit

Figure 5:
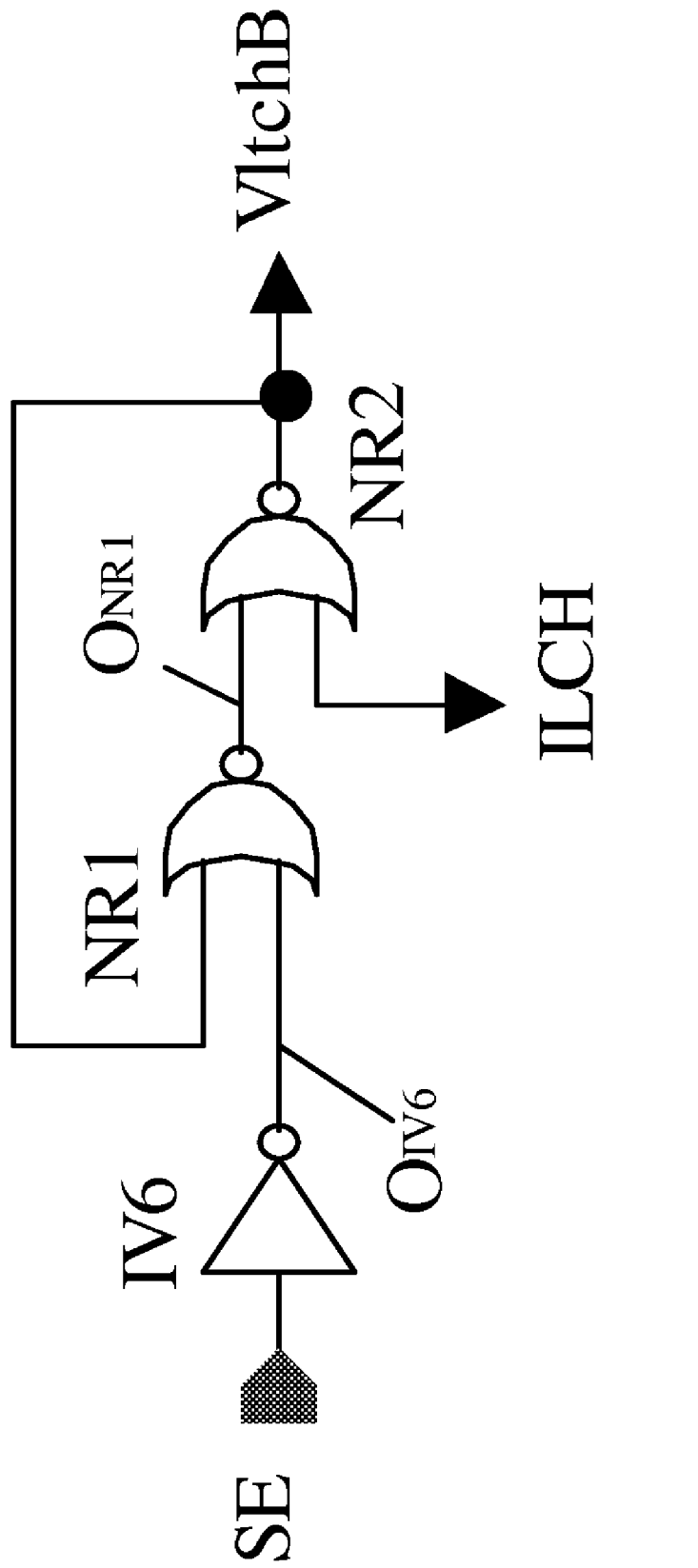
FIG. 5 is a detailed schematic diagram of the latch circuit in FIG. 1, in accordance with some embodiments.

FIG. 5 is a diagram schematic of latch circuit LCH (e.g., circuit 500), in accordance with some embodiments. Here, latch circuit 500 acts as a memory device, and at the beginning of a read cycle generates signal VltchB and feeds it back to pre-charge circuit PC (e.g., circuit 200 or circuit 400) to be used in the next phase of a read cycle. In the below illustration, pre-charge circuit 200 is used, but the illustrative principles are equally applicable to pre-charge circuit 400. The logic state of the pre-charge shut-off signal VltchB (active low) is stored inside latch circuit LCH by NOR gates NR1 and NR2. The latch (e.g., NOR gates NR1 and NR2) stores the low state VltchB in each read operation after the pre-charge operation is complete. When voltage Vsense is charged to just over trip_iv1, signal ILCH rises towards Vdd and causes signal VltchB to be low, and then signal $O_{NR1}$ to be Vdd, which causes VltchB to be low, regardless of signal ILCH. Signal ILCH is then pulled down to Vss or up to Vdd in the sensing stage by the current competition between currents $I_{M1}$ and $I_{P1}$ for the data high or low, respectively. The low logic for the pre-charge done signal VtlchB is stored once the sensing starts in each read operation until the next read.

For example, at the beginning of the read cycle, signal SE is driven low, resulting in a high at node $O_{IV6}$, which overrides input VltchB of NOR gate NR1 to result in a low at node $O_{NR1}$. Voltage VltchB, the output of NOR gate NR2, is therefore the inverse of input ILCH. At that time the voltage at node Vsense is at low logic level, resulting in a low for signal ILCH. As a result, signal VltchB is high. Also, at the same time, signal SE being low at an input of NAND gate ND1 (FIG. 2) overrides signal VltchB to result in a high signal PchgB that turns off pre-charge circuit 200. When signal SE is activated high for reading, the logic high of signal SE together with the logic high of signal VltchB at NAND gate ND1 causes a low at node PchgB to enable pre-charge circuit 200 to charge node Vsense. In some embodiments, after voltage at node Vsense is charged to a desired high level (e.g., trip point trip_iv1), signal ILCH generated from the voltage at node Vsense by inverters IV1 and IV2, is also high, which overrides signal $O_{NR1}$ to result in a low voltage VltchB, and thus turns off pre-charge circuit 200.

Pre-Charging/Sensing Operation

Signals SE and SEB, the inverse logic of signal SE, control the reading of sense amplifier SA. Signal SE controls transistor N1, latch circuit LCH, and pre-charge circuit PC. Signal SEB, the inverse logic of signal SE, controls transistors P2 and N2. The term "pre-charge" commonly refers to charging node Vsense before sensing. In some embodiments, signal SE is deactivated to a low logic level when transitioning from reading between a bit cell (e.g., memory cell M1) to the next bit cell.

Figure 6:
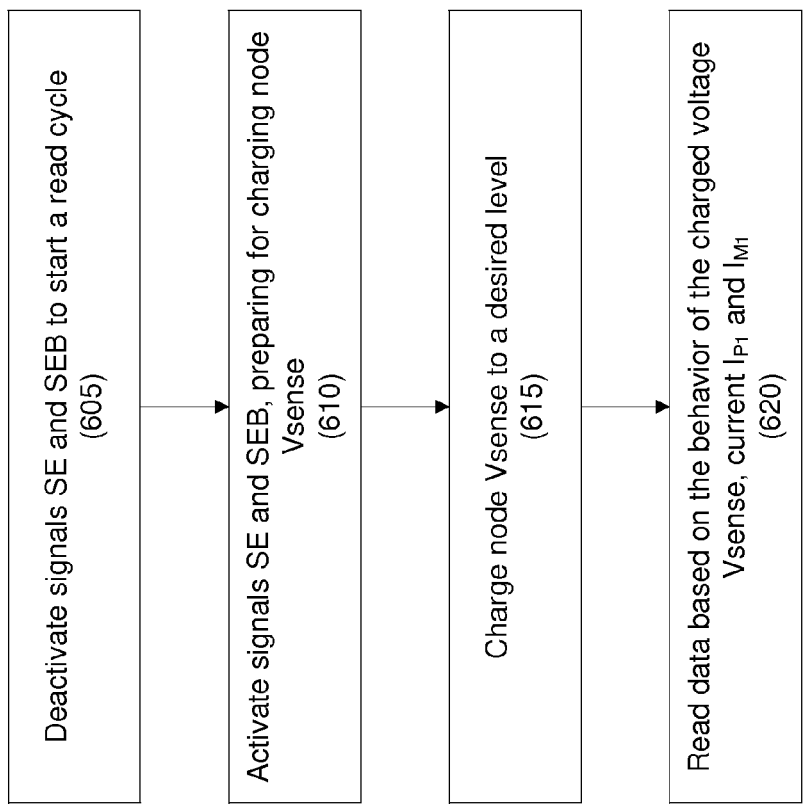
FIG. 6 is a flowchart illustrating a method of operation of the circuit in FIG. 1, in accordance with some embodiments.

FIG. 6 is a flowchart 600 of a method illustrating a read operation of circuit 100, in accordance with some embodiments.

In step 605, signals SE and SEB are deactivated (e.g., driven low and high, respectively) to prepare the sense amplifier for charging and sensing. The deactivated signal SE inputted to pre-charge circuit PC resets pre-charge circuit PC via latch circuit LCH, sets up the VltchB signal for pre-charge circuit PC to charge node Vsense in the next cycle, and turns off transistor N1 to disconnect node Vsense from memory cell M1. The deactivated signal SEB turns off transistor P2, disconnects node Vsense from receiving current $I_{P1}$ from transistor P1, and turns on transistor N2 and connects node Vsense to transistor N2. Because node Vsense is disconnected from transistor P1 and memory M1, but only connected to the then turned-on transistor N2, transistor N2 pulls node Vsense to a low.

In step 610, signal SE and SEB are activated (e.g., driven, high and low, respectively) to prepare the sense amplifier for charging node Vsense. The activated signal SE at the gate of transistor N1 turns on transistor N1 and connects node Vsense to memory cell M1. The activated signal SEB at the gate of transistor P2 turns on transistor P2, and connects node Vsense to transistor P1, allowing current $I_{P1}$ to flow through node Vsense. The activated signal SEB at the gate of transistor N2 also disconnect node Vsense from transistor N2. The activated signal SE at the pre-charge circuit PC together with the previous state of signal VltchB feedback to pre-charge circuit PC enables pre-charge circuit PC to charge node Vsense.

In step 615, pre-charge circuit PC charges node Vsense, and when node Vsense is sufficiently charged (e.g., to trip point trip_iv1), the high level of node Vsense, through inverters IV1 and IV2, triggers latch circuit LCH to provide a low signal VltchB to stop pre-charge circuit PC from charging node Vsense.

In step 620, the data is read at output OUT based on the behavior of voltage at node Vsense, current $I_{P1}$, and current $I_{M1}$. Once pre-charge circuit PC is off, voltage at node Vsense, at the charged level, increases towards voltage Vdd based on the current $I_{P1}$, with little or no current $I_{M1}$, if memory M1 stores a low logic level. Because node Vsense is high, output OUT, which is the logic level at node Vsense inverted by three inverters IV1, IV2, and IV3, is low, which is consistent with the low data stored in memory cell M1. On the other hand, once the pre-charge completes, if memory cell M1 stores a high, the voltage at node Vsense, at the charged level, is pulled to lower than trip_iv1 because the current $I_{M1}$ at that time is much larger than the reference current $I_{P1}$. When the voltage at node Vsense is pulled to lower than trip point trip_iv1, the logic level at node Vsense is considered a low, resulting in a high at output OUT, which is also consistent with the data high stored in memory cell M1. As a result, in both the pre-charge phase and sense phase, the read data at output OUT reflects the data stored in memory cell M1.

Some embodiments are low power and/or high speed. The low power is achieved for various reasons. For example, in some embodiments, the pre-charge circuit is set at the highest bias (e.g., trip_iv5) that voltage at node Vsense can reach during pre-charging, and trip_iv5 is very close to trip_iv1 (e.g., by proper transistor sizing). As a result, the optimum charge is used for pre-charging, resulting in low power reading. The pre-charge circuit (e.g., circuit 200, circuit 400, etc.) is automatically turned off once the voltage at node Vsense reaches trip_iv1, which saves power consumption and reading power. Because of the automatic turn off, some embodiments do not use an extra circuit to turn off the pre-charge circuit, and the constant bit line (or the voltage at node Vsense) is spared during reading, which further saves power.

The advantage of high speed is also achieved for various reasons. In some embodiments, the pre-charge circuit (e.g., circuit 200, circuit 400, etc.) is adjusted for fast charging regardless of the bit line loading to prevent over and/or under pre-charge. Reducing the bit line loading dependency is an effective way to allow faster access. The short circuit between the input and the output of inverter IV5 enables the voltage level of node Vsense to be in between trip_iv1 and trip_iv5, regardless of the bit line loading. In some embodiments, the pre-charge current is configured to be large to shorten the pre-charge time, but node Vsense is not overcharged because, as illustrated, the voltage at node Vsense is limited in between trip points trip_iv1 and trip_iv5 for sensing. Because the highest voltage at node Vsense in the pre-charge stage is adjusted to be higher than trip_iv1, but as close to trip_iv1 as possible, the sensing time is reduced in the current competition between $I_{P1}$ and $I_{M1}$ to allow the voltage at node Vsense to rise over or to fall below trip_iv1 for the data low or high, respectively.

A number of embodiments have been described. It will nevertheless be understood that various modifications may be made without departing from the spirit and scope of the embodiments. For example, pre-charge circuit PC and latch circuit LCH are shown for illustration only, other pre-charge circuits and/or latch circuits are within the scope of the embodiments. "Ground" is used as a reference for a low logic level, but Vss can be used in place of ground. Transistors P2 and N1 function as a gating device or a switch, but comparable gating devices or switches may be used. The method example was disclosed with exemplary steps, which are not necessarily performed in the order as explained. Steps may be added, replaced, changed in order, and/or eliminated as appropriate, in accordance with the spirit and scope of this disclosure.

Each claim of this document constitutes a separate embodiment, and embodiments that combine different claims and/or different embodiments are within scope of the disclosure and will be apparent to those of ordinary skill in the art after reviewing this disclosure. Accordingly, the scope of the invention should be determined with reference to the following claims, along with the full scope of equivalences to which such claims are entitled.

What is claimed:

1. A circuit comprising:
   a node having a node voltage;
   a memory cell coupled to the node;
   a first device coupled to the node;
   a charge circuit coupled to the node; and
   a feedback circuit coupled to the node,
   wherein during a pre-charge cycle of the memory cell:
      the first device is configured to cause the node voltage to transition to a first voltage level,
      the charge circuit is configured to cause the node voltage to transition to a second voltage level after the node voltage equals the first voltage level, the second voltage level being different from the first voltage level; and
      the feedback circuit is configured to selectively activate or deactivate the charge circuit in response to the node voltage.

2. The circuit of claim 1, further comprising a second device coupled to the node and configured to provide a reference current for use in determining a logic level of a read datum during a read cycle of the memory cell.

3. The circuit of claim 2, wherein the memory cell is configured to generate a memory cell current, and the logic level of the read datum is determined according to comparison of a ratio of the reference current to the memory cell current and a predetermined threshold value.

4. The circuit of claim 1, further comprising an output circuit coupled between the node and the feedback circuit and configured to generate a read datum for the memory cell during a read cycle of the memory cell.

5. The circuit of claim 1, wherein the feedback circuit is configured to generate a feedback signal in a first phase of a read cycle, and the feedback signal is used in a second phase of the read cycle to deactivate the charge circuit.

6. The circuit of claim 1, wherein the charge circuit comprises:
   a first inverter having a first PMOS transistor coupled in series with a first NMOS transistor, an output of the first inverter coupled to an input of the first inverter and to the node.

7. The circuit of claim 6, further comprising an output circuit that includes a second inverter having a second PMOS transistor coupled in series with a second NMOS transistor, and the first inverter configured to have a trip point higher than a trip point of the second inverter.

8. The circuit of claim 7, wherein the trip point of the first inverter is configured by sizing one or a combination of the first PMOS transistor and the first NMOS transistor, and the trip point of the second inverter is configured by sizing one or a combination of the second PMOS transistor and the second NMOS transistor.

9. The circuit of claim 1, further comprising a second device configured to selectively connect/disconnect the memory cell to/from the node.

10. A circuit comprising:
    a node having a node voltage;
    a first device coupled to the node;
    a memory cell coupled to the node;
    a charge circuit coupled to the node;
    a second device coupled to the node;
    a feedback circuit coupled to the node; and
    an output circuit coupled to the node and the feedback circuit,
    wherein during a first phase of a read cycle of the memory cell:
       the first device configured to cause the node voltage to transition to a first voltage level; and
       the second device and the memory cell are configured to be electrically disconnected from the node,
    wherein during a second phase of the read cycle:
       the charge circuit configured to cause the node voltage to transition to a second voltage level different from the first voltage level; and
    wherein during a third phase of the read cycle:
       the second device and the memory cell are configured to be electrically connected to the node;
       the feedback circuit configured to deactivate the charge circuit; and
       the output circuit configured to generate a read datum for the memory cell.

11. The circuit of claim 10, further comprising
    a multiplexer;
    a third device configured to selectively connect/disconnect the node to/from the second device electrically; and
    a fourth device configured to selectively electrically connect/disconnect, via the multiplexer, the node to/from the memory cell.

12. The circuit of claim 10, wherein the second device is configured to provide a reference current for use in determining a logic level of the read datum during the read cycle of the memory cell.

13. The circuit of claim 12, wherein the memory cell is configured to generate a memory cell current, and the logic level of the read datum is determined according to comparison of a ratio of the reference current to the memory cell current and a predetermined threshold value.

14. A circuit comprising:
    an output circuit having an input node, the input node having an input node voltage level, and the output circuit being configured to generate an output signal having a first logic state during a period that the input node voltage level is equal to or greater than a trip voltage level of the output circuit and to generate the output signal having a second logic state during a period that the input node voltage level is less than the trip voltage level of the output circuit;
    a feedback circuit coupled to the output circuit and configured to generate a feedback control signal according to the output signal from the output circuit; and
    a charge circuit coupled to the feedback circuit for receiving the feedback control signal and coupled to the input node of the output circuit,
    the feedback circuit being configured to, via the feedback control signal, selectively activate the charge circuit to charge the input node or selectively deactivate the charge circuit in response to the output signal.

15. The circuit of claim 14, wherein the feedback circuit is configured to activate the charge circuit in response to the output signal having the first logic state and to deactivate the charge circuit in response to the output signal having the second logic state.

16. The circuit of claim 14, further comprising:
    a memory cell; and
    a switch circuit configured to selectively connect/disconnect the input node to/from the memory cell.

17. The circuit of claim 14, wherein the output circuit comprises at least one inverter, and the trip voltage of the output circuit is the trip voltage of the at least one inverter.

18. The circuit of claim 14, wherein the charge circuit comprises:

a PMOS transistor; and an NMOS transistor coupled in series with the PMOS transistor, gate terminals of the PMOS transistor and the NMOS transistor are coupled to drain terminals of the PMOS transistor and the NMOS transistor.

19. The circuit of claim 18, wherein the charge circuit further comprises:

a switch configured to selectively couple the PMOS transistor or the NMOS transistor to a power node in response to the feedback control signal.

20. The circuit of claim 18, wherein the PMOS transistor and the NMOS transistor are configured to have a voltage level at the drain terminals of the PMOS transistor and the NMOS transistor during a period that the charge circuit is activated, and the voltage level is greater than the trip voltage of the output circuit.

* * * * *